United States Patent [19]

Tsuda

[11] 4,329,646
[45] May 11, 1982

[54] IMPULSE RESONANCE SPECTROMETER
[75] Inventor: Munetaka Tsuda, Ibaraki, Japan
[73] Assignee: Hitachi, Ltd., Tokyo, Japan
[21] Appl. No.: 148,404
[22] Filed: May 9, 1980
[30] Foreign Application Priority Data
  May 21, 1979 [JP] Japan .................................. 54-61447
[51] Int. Cl.³ .......................................... G01N 27/00
[52] U.S. Cl. .................................... 324/307; 324/314
[58] Field of Search ........................ 324/300, 307, 314
[56] References Cited

U.S. PATENT DOCUMENTS 2,960,650 11/1960 Pinkleg ................................. 324/314
3,534,252 10/1970 Laukien ................................ 324/314
4,065,714 12/1977 Hill ..................................... 324/314

Primary Examiner—Michael J. Tokar
Attorney, Agent, or Firm—Craig and Antonelli

[57] ABSTRACT

An impulse resonance spectrometer is provided, wherein high frequency energy in the shape of pulses is applied to a sample material located in a polarizing magnetic field, to detect a nuclear magnetic resonance signal from the sample material. The spectrometer includes a first oscillator which oscillates at a first high frequency for generating a first frequency signal corresponding to a main signal of the nuclear magnetic resonance signal. A nuclear magnetic resonance signal measuring device measures the difference between frequencies of the main signal and a subsidiary signal of the nuclear magnetic resonance signal detected from the sample material by applying the output of the first oscillator to the sample material. A second oscillator in the form of a phase-locked loop oscillates to produce an output corresponding to the frequency signal from the nuclear magnetic resonance signal measuring device, and a mixer modulates the first oscillator output with the output of the second oscillator and oscillates at a second high frequency for applying to the sample material a second frequency signal corresponding to the subsidiary signal.

12 Claims, 6 Drawing Figures

IMPULSE RESONANCE SPECTROMETER

BACKGROUND OF THE INVENTION

This invention relates to a nuclear magnetic resonance spectrometer, and more particularly to an impulse resonance spectrometer wherein high frequency energy in the shape of pulses is applied to a sample material located in a polarizing magnetic field, to detect the nuclear magnetic resonance signal of the sample material.

It is known that when high frequency energy at an angular frequency $\omega$ is applied to a sample material located in a polarizing magnetic field denoted by $H_o$, a nuclear magnetic resonance is caused by fulfilling the relationship $\omega = \gamma H_o$ where $\gamma$ denotes the gyromagnetic ratio of a measured nucleus.

According to the condition of the nuclear magnetic resonance, only a signal having one peak ought to appear. However, a signal having many peaks appears under the influences of the electro-negativity of an adjacent atom or group based on a molecular structure, any magnetic anisotropy, and/or the polarizing magnetic field. This split is called the chemical shift.

The chemical shift is useful in that the molecular structure of the sample material can be discriminated by reading the difference between the peak of the resonant line of tetramethylsilane (TMS) usually employed as a reference material for measuring the chemical shift and the peak of another spectrum, that is, the difference between frequencies.

The nuclear magnetic resonance spectra, however, include besides the chemical shift another split attributed to the fact that two or more spins of the nuclei exhibiting the magnetic resonance have interactions among them. This split is called the spin-spin coupling.

The spin-spin coupling principally occurs between molecules whose coupling states with the hydrogen nucleus are approximate.

The utility of researches on molecular structures doubles owing to the split of the nuclear magnetic resonance signal attributed to the interaction in the spin-spin coupling. On the other hand, however, the nuclear magnetic resonance signal becomes complicated, and the interpretation and analysis thereof are not simple.

Further, it is known that when the second high frequency energy $H_2$ is applied to one nucleus in the spin-spin coupling generated by applying the first high frequency energy $H_1$ to the sample material, the other observed nucleus apparently has the spin-spin coupling erased or changes in the magnitude of coupling or splits, so spectra different from the original resonance signal are observed. Thus, the situation of the interaction between the nuclei can be known, and simultaneously the split based on the spin-spin coupling and the split based on the chemical shift can be discriminatively observed.

The method of measurement which is performed by applying the two different sorts of high frequency energies $H_1$ and $H_2$ to the sample material is called the spin decoupling. The spin decoupling is a measurement method which is indispensable especially to the analysis of the resonance spectra of the hydrogen nucleus.

An impulse resonance spectrometer which detects a nuclear magnetic resonance signal by applying the first high frequency energy in the shape of pulses to a sample material located in a polarizing magnetic field has been known from, for example, U.S. Pat. No. 3,475,680.

To carry out the spin decoupling in a continuous wave resonance spectrometer wherein a nuclear magnetic resonance signal is detected by applying the first high frequency energy $H_1$ in the shape of continuous waves to a sample material located in a polarizing magnetic field, has been known from, for example, U.S. Pat. No. 3,348,137.

However, there has not been known yet the concrete construction of an impulse resonance spectrometer in which in performing the spin decoupling by applying the second high frequency energy $H_2$ to a sample material, the frequency of the second high frequency energy $H_2$ can be precisely measured from a nuclear magnetic resonance signal and the first and second high frequency energies can be held stable for a long time.

SUMMARY OF THE INVENTION

An object of this invention is to provide an impulse resonance spectrometer in which, in performing the spin decoupling by applying the second high frequency energy $H_2$ to a sample material, the second high frequency energy $H_2$ can be precisely measured from a nuclear magnetic resonance signal and the first and second high frequency energies can be held stable over a long time.

This invention disposes a nuclear magnetic resonance signal measuring device which measures the difference of frequencies between a main signal to be stated later and a subsidiary signal to be stated later in a nuclear magnetic resonance signal, the main signal being generated by applying the first high frequency energy $H_1$ to a sample material by means of a first oscillator, the energy $H_1$ having a first frequency corresponding to the main signal. In addition, this invention disposes a mixer which modulates an output of the first oscillator with an output of a second oscillator that oscillates a frequency corresponding to the difference of frequencies between the main signal and the subsidiary signal. Using the mixer, the second high frequency signal $H_2$ corresponding to the subsidiary signal is applied to the sample material, whereby the occurrence of the spin decoupling can be automatically observed.

This invention can automatically perform the spin decoupling by disposing the nuclear magnetic resonance signal measuring device, the second oscillator, and the mixer, and can therefore accomplish the object.

DESCRIPTION OF THE PREFERRED EMBODIMENTS

Figure 1:
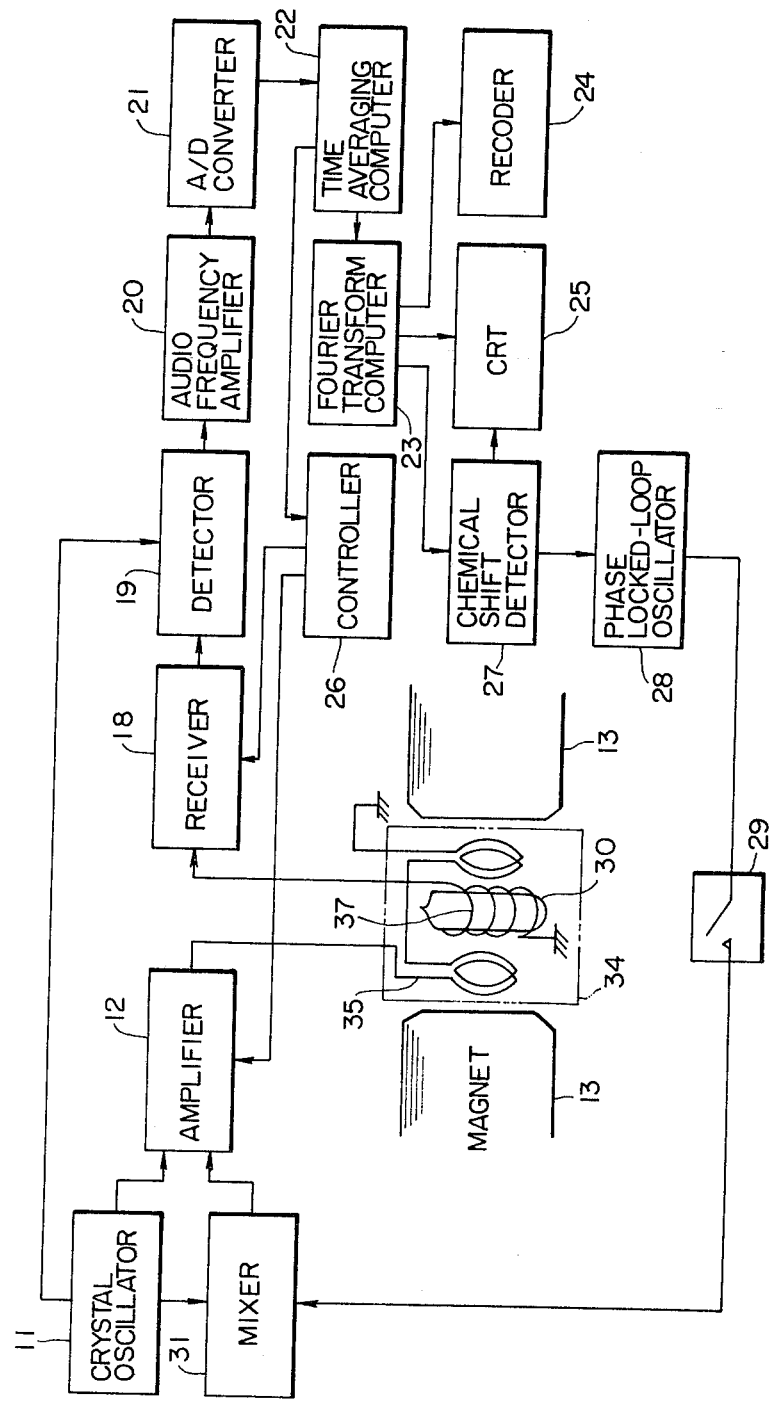
FIG. 1 is a block diagram of a Fourier transform nuclear magnetic resonance spectrometer for hydrogen nuclei to which an impulse resonance spectrometer of this invention is applied.

As shown in FIG. 1, an impulse resonance spectrometer according to this invention comprises a first oscillator which oscillates to produce first high frequency energy $H_1$ having a first frequency corresponding to a main signal to be stated later in a nuclear magnetic resonance spectrometer signal, a nuclear magnetic resonance signal measuring device which measures the difference of frequencies between the main signal of the nuclear magnetic resonance signal from a sample material and a subsidiary signal to be stated later in the nuclear magnetic resonance signal, the main signal being generated by applying an output of the first oscillator to the sample material, a second oscillator which oscillates at a frequency corresponding to the difference of frequencies of the main signal and the subsidiary signal of the nuclear magnetic resonance signal as measured by the device, and a mixer which modulates the output of the first oscillator with an output of the second oscillator and which generates a high frequency signal having a second frequency component equivalent to second high frequency energy $H_2$ corresponding to the subsidiary signal of the nuclear magnetic resonance signal.

Here, the first oscillator consists of a crystal oscillator 11 for oscillating the first frequency $\omega_1$ corresponding to the main signal of the nuclear magnetic resonance signal, and an amplifier 12 for amplifying the output of the crystal oscillator 11.

FIG. 1 shows an example of a Fourier transform nuclear magnetic resonance spectrometer for hydrogen nuclei which has a magnet 13 at 14 kilogauss. The crystal oscillator 11 oscillates at a frequency of 60 MHz. When the first high frequency energy $H_1$ amplified to an amplitude of 20 volts by the amplifier 12 is applied to an irradiation coil 35 of a probe 34 installed within the field of the magnet 13 of 14 kilogauss, the hydrogen nucleus in a sample tube 30 gives rise to a nuclear magnetic resonance. The resonance signal is detected by a detecting coil 37 wound round the sample tube 30.

The nuclear magnetic resonance signal measuring device consists of a receiver 18 for amplifying the output of the detecting coil 37, a detector 19 for detecting an output of the receiver 18, an audio frequency amplifier 20 for amplifying a signal converted into an audio frequency by means of the detector 19, an analog-to-digital converter 21 for converting an output of the amplifier 20 into a digital quantity, a time average computer 22 for averaging the output of the converter 21, a Fourier transform computer 23 for Fourier-transforming an output of the computer 22, a first display 25 for displaying the components of the main signal or the subsidiary signal discriminated at the respective frequencies by means of the Fourier transform computer 23, and a chemical shift detector 27 for detecting the difference of the frequencies of the main signal and the subsidiary signal of the nuclear magnetic resonance signal, that is, the chemical shift. A recorder 24 serves to record the output of the Fourier transform computer 23. In order to realize the optimum data collection of the time average computer 22 in synchronism with the first pulse-shaped high frequency energy $H_1$, the time average computer 22 controls the amplifier 12 and the receiver 18 by means of a controller 26. The detector 19 detects the nuclear magnetic resonance signal over a range of about 1,200 Hz by making the position of the first high frequency energy $H_1$ the zero Hz with a feed-forward signal from the crystal oscillator 11.

The second oscillator 28 is constructed of a phase locked-loop oscillator to be described later. Upon closing a change-over switch 29, the spin decoupling can be performed by the use of the apparatus according to this invention.

The mixer 31 functions to modulate the output of the first oscillator 11 with the output of the second oscillator 28. This mixer 31 oscillates the high frequency energy $H_2$ of the second frequency corresponding to the subsidiary signal and applies it to the amplifier 12.

Figure 2:
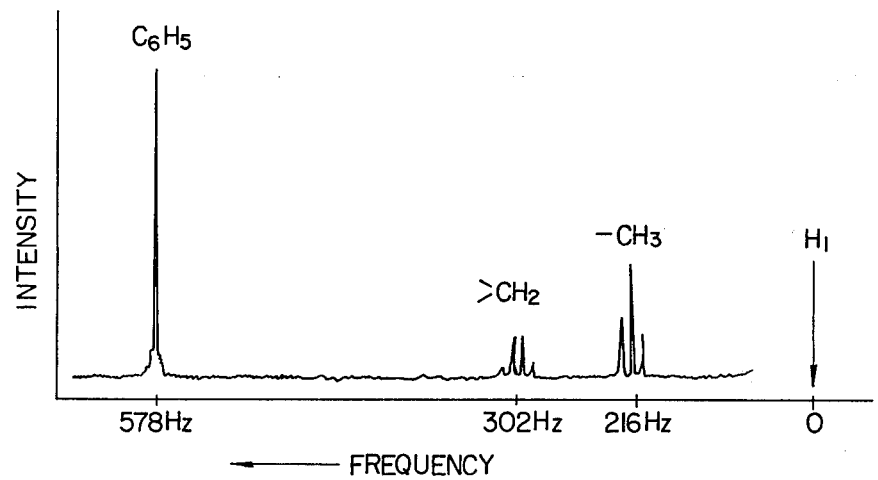
FIG. 2 shows a nuclear magnetic resonance spectrum of ethyl benzene obtained with the impulse resonance spectrometer illustrated in FIG. 1.

FIG. 2 shows a spectrum obtained in such a way that the nuclear magnetic resonance signal of ethyl benzene measured by the impulse resonance spectrometer shown in FIG. 1 is displayed on the oscilloscope (CRT) 25 being the first display. The axis of abscissas represents the frequency, while the axis of ordinates represents the intensity of the peak of the resonance signal. The reference point of the axis of abscissas is the first frequency $H_1$ necessary for bringing the nucleus of hydrogen into the spin resonance (60 MHz in the Fourier transform nuclear magnetic resonance spectrometer for hydrogen nuclei having the field of magnet 13 of 14 kilogauss as shown in FIG. 1). In the spectrum of FIG. 2, the spectra of hydrogen not shown appearing at the reference point O become the main signals. As shown in FIG. 2, the spectra of methyl group $CH_3$, methylene group $CH_2$ and phenyl group $C_6H_5$ of ethyl benzene $C_6H_5CH_2CH_3$ appear at positions of 216 Hz, 302 Hz and 578 Hz, respectively. These spectra of the methyl group, methylene group and phenyl group correspond to the subsidiary signals defined in this invention, respectively. In the case of ethyl benzene, as seen from FIG. 2, the nuclear magnetic resonance signals of the methyl group $CH_3$ and the methylene group $CH_2$ are respectively split into three and four peak spectra by the spin-spin coupling.

In this invention, the following method is employed in order to find the spin-spin coupling of the methyl group and the methylene group in the above example.

Figure 3:
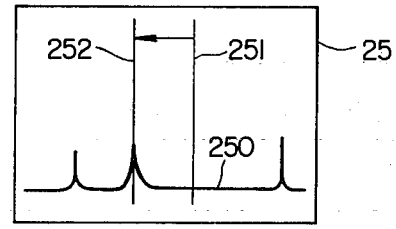
FIG. 3 shows a spectrum and a marker signal which are indicated on a first display of the impulse resonance spectrometer of this invention.

As shown in FIG. 3, the CRT 25 displays thereon the spectrum of the nuclear magnetic resonance signal 250 on the basis of the output of the Fourier transform computer 23, and it simultaneously displays thereon a marker signal 251 moving along the axis of abscissas, namely, the frequency axis in parallel on the basis of the output of the chemical shift detector 27 to be described later. Let it be supposed that the marker signal 251 is brought into the position, for example, 252 of one spectrum considered to be subject to the spin-spin coupling. At this time, the apparatus according to this invention applies a frequency, corresponding to the position of the marker signal 252, to the sample material as the second high frequency energy $H_2$. Assuming that the spectrum corresponding to the position of the marker signal 252 is thus erased from the display of the CRT 25, a molecule corresponding to this position is one of the molecules under the spin-spin coupling.

Figure 4:
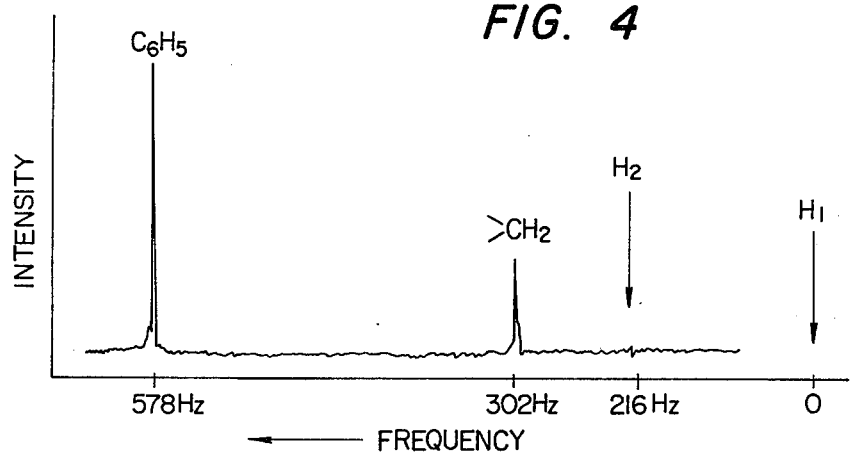
FIG. 4 shows a nuclear magnetic resonance spectrum of ethyl benzene measured by the spin decoupling in the spectrum depicted in FIG. 2.

FIG. 4 illustrates the state in which, when the marker signal 252 shown in FIG. 3 has been brought into the position of the methyl group at 216 Hz in the spectrum of ethyl benzene in FIG. 2, the methyl group $CH_3$ has disappeared and the four split peak spectra of the methylene group $CH_2$ has become one peak. Thus, it is ascertained that the methyl group $CH_3$ and the methylene group $CH_2$ have undergone the spin-spin coupling.

Figure 5:
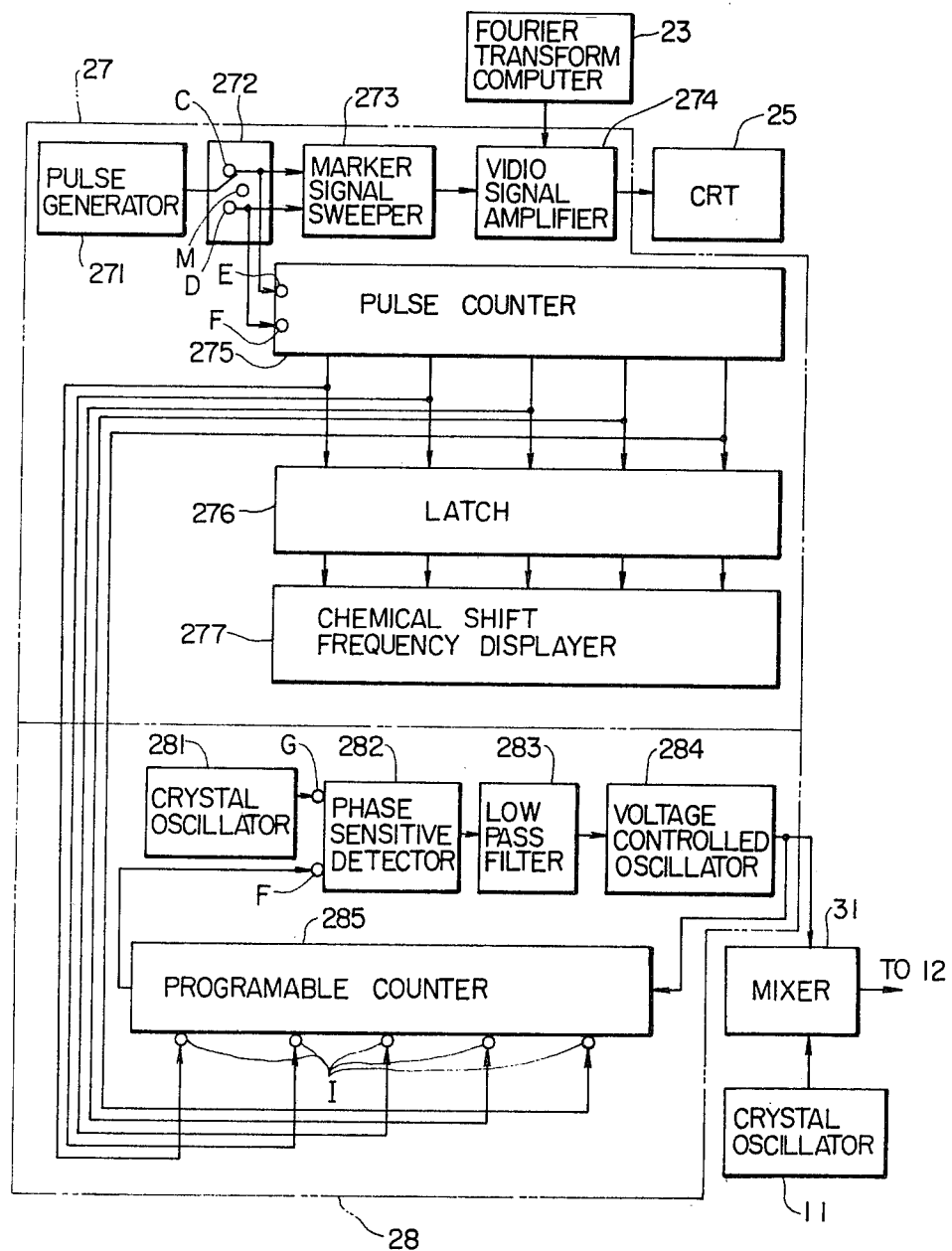
FIG. 5 is a block diagram of a chemical shift detector and a second oscillator which are applied to this invention.

FIG. 5 shows a block diagram of the chemical shift detector 27 and the phase locked-loop oscillator 28 illustrated in FIG. 1.

As shown in FIG. 5, the chemical shift detector 27 consists of a pulse generator 271, a switch 272, a marker signal sweeper 273, a video signal amplifier 274, a pulse counter 275, and a chemical shift frequency display 277 as a second display.

An output pulse of the pulse generator 271 is applied to the marker signal sweeper 273 through the switch 272. The marker signal sweeper 273 is constructed of a digital-to-analog converter which generates a voltage proportional to the number of the pulses of the pulse generator 271. The output voltage is applied to the video signal amplifier 274. On the other hand, also the nuclear magnetic resonance signal stored in the Fourier transform computer 23 is applied to the video signal amplifier 274 and is displayed on the CRT 25 in superposition on the marker signal 251.

When the switch 272 is thrown onto a side C, the marker signal sweeper 273 generates the voltage so that the marker signal 251 may move leftwards on the CRT 25, and when the switch is thrown onto a side D, the marker signal sweeper generates the voltage so that the marker signal may move rightwards. When a finger is released from the switch 272, this switch is automatically returned onto a side M by means of a spring, so that the pulses from the pulse generator 271 are prevented from entering the marker signal sweeper 273. The output pulses of the pulse generator 271 are connected so as to enter a count-up input terminal E of the 5-bit pulse counter 275 from the C terminal of the switch 272 and to enter a count-down input terminal F from the D terminal. The outputs of the pulse counter 275 are connected to a latch 276 as a frequency display driver circuit, and the frequency counted by the pulse counter 275 is displayed on the chemical shift frequency display 277.

By way of example, the output voltage of the marker signal sweeper 273 is set so that when ten pulses have been applied from the pulse generator 271 to the marker signal sweeper 273, the marker signal 251 may move 1 Hz on the CRT 25. Then, the chemical shift frequency display can display the frequencies of from 0000.1 Hz to 9999.9 Hz with the unit being 0.1 Hz. In actuality, 1200.0 Hz suffices as the range of the nuclear magnetic resonance signal of the hydrogen nucleus as stated before. The marker signal may well be a single line which intersects orthogonally to the nuclear magnetic resonance spectra. Alternatively, it may become a point obtained by increasing the brightness of one point on the nuclear magnetic resonance spectra.

A measurer throws the switch 272 onto either the C side or the D side so as to horizontally move the marker signal 251 on the CRT 25 along the axis of abscissas, and releases the finger from the switch 272 so as to automatically return the switch 272 onto the M side when the nuclear magnetic resonance spectra to be measured and the marker signal 252 as are indicated on the CRT 25 have coincided. Thus, the marker signal 272 stops on the nuclear magnetic resonance spectra to be measured, and the frequency corresponding to the stop position is indicated on the chemical shift frequency display 277 serving as the second display. Simultaneously therewith, the particular frequency is delivered to the phase locked-loop oscillator 28.

When the nuclear magnetic resonance spectra coincident with the marker signal 252 have disappeared from the display of the CRT 25, the measurer can precisely know the nuclear magnetic resonance frequency of one nucleus under the spin-spin coupling from the numerical value indicated on the chemical shift frequency display 277.

Now, the phase locked-loop oscillator 28 which functions as the second oscillator for oscillating a frequency corresponding to the indicated frequency of the chemical shift frequency display 277 will be described with reference to FIG. 5.

A crystal oscillator 281 at 1 KHz is connected to one input terminal G of a phase sensitive detector 282. An output from the phase sensitive detector 282 is applied to a voltage controlled oscillator 284 through a low pass filter 283. An output from the voltage controlled oscillator 284 enters the other input terminal F of the phase sensitive detector 282 via a 5-bit programable counter 285. The phase sensitive detector 282 detects and provides the phase difference between the two input signals, so that the voltage controlled oscillator 284 oscillates the numerical value set in the programable counter 285, in KHz. When set terminals I of the programable counter 285 and the output terminals of the pulse counter 275 are connected, the voltage controlled oscillator 284 oscillates the frequency corresponding to the position of the marker signal. When this output is combined in the mixer 31 with the output of the crystal oscillator 11 which oscillates the frequency of the first nuclear magnetic resonance energy $H_1$, the second nuclear magnetic resonance energy $H_2$ can be obtained.

The embodiment concerning FIGS. 2 and 4 has been described as to the case where the main signal based on the hydrogen nucleus is used as the frequency of the first nuclear magnetic resonance energy $H_1$. In case where the nuclear magnetic resonance spectrum of the sample material is to be displayed by employing the frequency of, for example, TMS (tetramethylsilane) as the reference main signal, an offset circuit may be added to the circuit of FIG. 5 as shown in FIG. 6.

Hereunder, the circuit of FIG. 6 will be described in comparison with the phase locked-loop oscillator 28 shown in FIG. 5.

Figure 6:
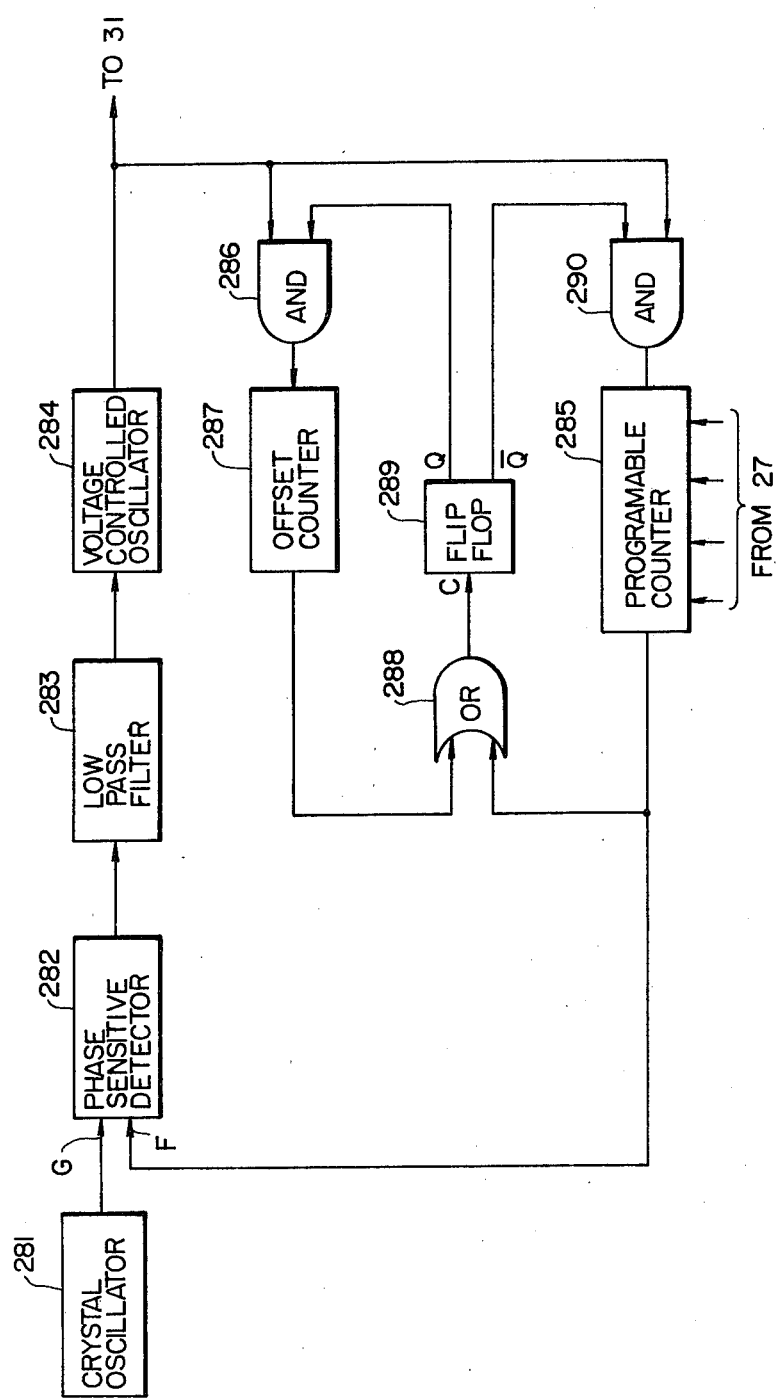
FIG. 6 is a block diagram showing a modification of the second oscillator which is applied to this invention.

In FIG. 6, parts assigned the same numerals as in FIG. 5 indicate the same contents. The point of difference between the circuit arrangements of FIGS. 6 and 5 is that in order to provide the offset circuit stated above, an AND circuit 286, an offset counter 287, an OR circuit 288 and a flip-flop circuit 289 are disposed anew in FIG. 6.

The point of difference between the operations of the circuits of FIGS. 6 and 5 is as follows. In response to the inputs from the chemical shift detector 27 to the programable counter 285, an output of the programable counter 285 is applied to a C terminal of the flip-flop circuit 289 through the OR circuit 288. The AND circuit 286 is enabled by an output from a Q terminal of the flip-flop circuit 289 and the output of the voltage controlled oscillator 284. The offset counter 287 begins to count outputs from the AND circuit 286, and delivers an output to one input terminal of the OR circuit 288 when it has counted the frequency of TMS (150 Hz in case where the nuclear magnetic resonance signal of hydrogen is a starting point). In response to the input from the OR circuit 288, the flip-flop circuit 289 provides an output from a $\bar{Q}$ terminal thereof. An AND circuit 290 is enabled by the outputs from the flip-flop circuit 289 and the voltage controlled oscillator 284, and an input is received at the F terminal of the phase sensitive detector 282 through the programable counter 285 for the first time. The subsequent operation is the same as the operation of the circuit shown in FIG. 5.

In this invention, the Fourier transform computer 23 stores therein the nuclear magnetic resonance averaged by the time averaging computer 22. Simultaneously, the stored content is delivered to the first and second displays 25 and 277. Accordingly, as the memory number of the Fourier transform computer 23 is made greater, the display precisions of the displays 25 and 277 are enhanced more.

Moreover, in this invention, when the marker signal 252 has been stopped on the spectra to-be-measured while observing the spectra indicated on the first display 25, the spin decoupling is discriminated on the basis of the disappearance of the spectra to-be-measured.

This measure will now be compared with a prior-art spin decoupling method. The reading of nuclear magnetic resonance spectra in the prior art is performed with a chart of a recorder. The frequency of the spectra known from the chart by visual observation, that is, the second frequency in this invention is applied to a sample material, and whether or not the spin decoupling consequently takes place is observed. The axis of abscissas of the chart is approximately 30 cm, and indicates 600 Hz. In case where, in performing the spin decoupling, one of the nuclei under the spin-spin coupling is not accurately irradiated with the second high frequency energy $H_2$, disadvantageously the one nucleus does not cause the spin decoupling though it ought to cause the same. The precision of frequencies required for accurately causing the spin decoupling is 0.5 Hz which is the half-width of the nuclear magnetic resonance signal. It is impossible, however, to read the frequency from the chart at the precision of 0.5 Hz. The magnitude of the frequency which can be actually read from the chart is approximately 1 Hz. It is accordingly difficult to accurately perform the spin decoupling with the prior-art system.

On the other hand, it is supposed in this invention that the capacity of the memory of the Fourier transform computer 23 is 8,000 points and that nuclear magnetic resonance signals in the range of 600 Hz are stored in the memory. In this case, the display precision of the CRT 25 becomes 0.01 Hz or smaller. In the above embodiment, to stop the marker signal 252 accurately on the nuclear magnetic resonance spectra can be readily achieved by lowering the moving speed of the marker signal 251 and raising the auto-return speed of the switch 272 to the M terminal. In the embodiment, accordingly, the measurement precision can be enhanced 100 times or so as compared with that of the prior-art system.

Thus, according to this invention, the frequency of one of the nuclei under the spin-spin coupling in the nuclear magnetic resonance spectrum can be read at high precision by the use of the nuclear magnetic resonance signal measuring device of this invention. Simultaneously, the second nuclear magnetic resonance energy $H_2$ is automatically obtained on the basis of the frequency read by the nuclear magnetic resonance signal measuring device, by the use of the second oscillator 28 and the mixer 31 of this invention, so that the frequency of the second high frequency energy $H_2$ can be set at high precision and that in association with the modulation of the output of the crystal oscillator 11 by the mixer 31, it becomes possible to hold the first and second high frequency energies $H_1$ and $H_2$ stable over a long time.

I claim:

1. An impulse resonance spectrometer wherein high frequency energy in the shape of pulses is applied to a sample material located in a polarizing magnetic field, to detect a nuclear magnetic resonance signal from the sample material, said impulse resonance spectrometer comprising:
    (1) a first oscillator which oscillates at a first high frequency for generating a first frequency signal corresponding to a main signal of the nuclear magnetic resonance signal,
    (2) a nuclear magnetic resonance signal measuring device which measures the difference between frequencies of the main signal and a subsidiary signal of the nuclear magnetic resonance signal detected from the sample material by applying the output of said first oscillator to the sample material;
    (3) a second oscillator in the form of a phase-locked loop which oscillates to produce an output corresponding to the frequency signal from said nuclear magnetic resonance signal measuring device; and
    (4) a mixer which modulates the first oscillator output with the output of said second oscillator and oscillates at a second high frequency for applying to the sample material a second frequency signal corresponding to the subsidiary signal.

2. An impulse resonance spectrometer according to claim 1, wherein said first oscillator generates electromagnetic waves necessary for bringing a nucleus of hydrogen into a spin resonance.

3. An impulse resonance spectrometer according to claim 1, wherein said second oscillator further comprises means to indicate peaks of the main signal and the subsidiary signal and also the marker signal with a reference point set at a frequency corresponding to a peak spectra-position of a control material for a chemical shift measurement, the position lying on said first display, in order to indicate the control material as the main signal on said first display.

4. An impulse resonance spectrometer wherein high frequency energy in the shape of pulses is applied to a sample material located in a polarizing magnetic field, to detect a nuclear magnetic resonance signal from the sample material, said impulse resonance spectrometer comprising:
    (1) a first oscillator which oscillates at a first high frequency for generating a first frequency signal corresponding to a main signal of said nuclear magnetic resonance signal;
    (2) a nuclear magnetic resonance signal detector which detects the difference between the frequencies of said main signal and a subsidiary signal of said nuclear magnetic resonance signal detected from said sample material by applying the output of said first oscillator to the sample material;
    (3) a computer which separately counts components of said main signal or said subsidiary signal corresponding to respective frequencies on the basis of said nuclear magnetic resonance signal detected by said nuclear magnetic resonance signal detector;
    (4) means for generating a first display which indicates the peak spectra of the components of said respective frequencies counted by said computer, on a frequency axis with a reference point set at said main signal generated in correspondence with said first frequency signal;

(5) a chemical shift detector which includes means to generate a marker signal moving in parallel along said frequency axis on said display, and means to stop the movement of said marker signal when said marker signal has reached a position of said subsidiary signal;

(6) a second oscillator which oscillates at a frequency corresponding to the stop position of said marker signal or said difference between frequencies of said main signal and said subsidiary signal; and (7) a mixer which modulates said first oscillator output with the output of said second oscillator and oscillates at a second high frequency to produce a second frequency signal for applying to said sample material said second frequency signal corresponding to said subsidiary signal.

5. An impulse resonance spectrometer according to claim 4, wherein said computer includes means for storing discrete time displaced components of the composite nuclear magnetic resonance signal in a time averaging computer, and means for transforming the stored signal by Fourier analysis for separating the different resonance components.

6. An impulse resonance spectrometer according to claim 4, wherein said chemical shift detector further comprises means for generating a second display which indicates a frequency corresponding to the stop position of the marker signal indicated on the chemical shift display.

7. An impulse resonance spectrometer wherein high frequency energy in the shape of pulses is applied to a sample material located in a polarizing magnetic field to detect a nuclear magnetic resonance signal from the sample material, comprising first oscillator means for generating said high frequency pulses and for applying said pulses to said sample material located in a polarizing magnetic field;

nuclear magnetic resonance signal detecting means for detecting a nuclear magnetic resonance signal from the sample material;

display means responsive to the output of said nuclear magnetic resonance signal detecting means for displaying a peak spectrum of said nuclear magnetic resonance signal;

signal generating means for generating a frequency signal having a frequency within the spectrum of said nuclear magnetic resonance signal;

marker generator means responsive to said signal generating means for superimposing on said spectrum a marker identifying the frequency of said frequency signal within the spectrum;

means for controlling said signal generating means for varying the frequency of said frequency signal; and mixer means for modulating the output of said first oscillator means with the output of said signal generator means to produce a second frequency signal and for applying said second frequency signal to said sample material.

8. An impulse resonance spectrometer according to claim 7, wherein said signal generating means includes a phase-locked loop for producing said frequency signal applied to said mixer means.

9. An impulse resonance spectrometer according to claim 7, wherein said signal generating means includes a pulse generator and said marker generator means includes a marker signal sweeper which generates a signal capable of controlling said display means to display a marker and being responsive to the receipt of pulses from said pulse generator for moving the position of said marker in the display.

10. An impulse resonance spectrometer according to claim 9, wherein said means for varying the frequency of said frequency signal includes manual means for applying pulses selectively to said first and second inputs of said marker signal sweeper to position said marker in said display, a pulse counter connected to said manual means for generating a count equal to the difference in the number of pulses applied to the first and second inputs of said marker signal sweeper, and a phase-locked loop responsive to the count generated by said pulse counter for generating said frequency signal applied to said mixer.

11. An impulse resonance spectrometer according to claim 10, wherein said signal generating means further includes indicating means responsive to the count generated by said pulse counter for indicating the frequency of said frequency signal applied to said mixer.

12. An impulse resonance spectrometer according to claim 7, wherein said nuclear magnetic resonance signal detecting means includes a Fourier transform computer.

* * * * *